US012664343B2

(12) United States Patent
Ye et al.

(10) Patent No.: US 12,664,343 B2
(45) Date of Patent: Jun. 23, 2026

(54) SYSTEM AND METHOD FOR PERFORMING SCAN CHAIN ECO

(71) Applicant: Easy-Logic Technology (Shenzhen) Co., Ltd., Shenzhen (CN)

(72) Inventors: Yu Ye, Shenzhen (CN); Feng Yuan, Shenzhen (CN); Xing Wei, Shenzhen (CN); Yi Diao, Shenzhen (CN); Xiaoqing Yang, Shenzhen (GD); Linhan Zheng, Shenzhen (CN); Yibo Wang, Shenzhen (CN); Xiaoqiang Li, Shenzhen (CN)

( * ) Notice: Subject to any disclaimer, the term of this patent is extended or adjusted under 35 U.S.C. 154(b) by 190 days.

(21) Appl. No.: 18/808,431

(22) Filed: Aug. 19, 2024

(65) Prior Publication Data

US 2026/0023907 A1 Jan. 22, 2026

(30) Foreign Application Priority Data

Jul. 22, 2024 (CN) ......................... 202410981490.1

(51) Int. Cl.
*G06F 30/333* (2020.01)
*G06F 30/323* (2020.01)
(Continued)

(52) U.S. Cl.
CPC .......... *G06F 30/333* (2020.01); *G06F 30/323* (2020.01); *G06F 30/3308* (2020.01); *G06F 30/367* (2020.01); *G06F 30/398* (2020.01)

(58) Field of Classification Search
CPC .. G06F 30/333; G06F 30/323; G06F 30/3308; G06F 30/367; G06F 30/398
(Continued)

(56) References Cited

U.S. PATENT DOCUMENTS 6,877,120 B2 * 4/2005 Yoshimoto ..... G01R 31/318536
716/103
7,350,122 B2 * 3/2008 Fredrickson ... G01R 31/318536
714/731
(Continued)

FOREIGN PATENT DOCUMENTS

CN 113742154 A 12/2021
CN 115983184 A * 4/2023
(Continued)

OTHER PUBLICATIONS

Diao et al., Chinese Patent Document No. CN-118332979-A, published Jul. 12, 2024, including abstract, claims and 1 drawing. (Year: 2024).*

(Continued)

*Primary Examiner* — Phallaka Kik

(57) ABSTRACT

The present application discloses a system and a method for performing a scan chain ECO, the method includes: receiving an original netlist input by a user as first input information, the original netlist contains original scan chain information; receiving a register modification list and a scan DEF file input by the user as second input information, wherein the register modification list is configured to indicate register information to be up-chained and/or register information to be down-chained; modifying the original netlist based on the first input information and the second input information, to complete up-chaining and/or down-chaining of a list of registers in the second input information to obtain a modified scan chain netlist; and receiving the modified scan chain netlist and returning the modified scan chain netlist to the user.

6 Claims, 4 Drawing Sheets

(51) Int. Cl.
    *G06F 30/3308*      (2020.01)
    *G06F 30/367*       (2020.01)
    *G06F 30/398*       (2020.01)

(58) Field of Classification Search
    USPC ..... 716/109, 103, 111, 136; 703/16; 714/33,
                               714/327, 733, 734
    See application file for complete search history.

(56)               References Cited

U.S. PATENT DOCUMENTS

| | | | | |
|---|---|---|---|---|
| 7,376,915 | B1 * | 5/2008 | Duewer ......... | G01R 31/318536 |
| | | | | 716/119 |
| 9,953,121 | B2 * | 4/2018 | Datta ...................... | G06F 30/34 |
| 12,007,440 | B1 * | 6/2024 | Arora ..................... | G11C 29/46 |
| 2002/0083398 | A1 * | 6/2002 | Takeyama ............... | G06F 30/30 |
| | | | | 716/102 |
| 2003/0037296 | A1 * | 2/2003 | Yoshimoto ..... | G01R 31/318536 |
| | | | | 714/726 |
| 2003/0145297 | A1 * | 7/2003 | Cote ........................ | G06F 30/33 |
| | | | | 716/106 |
| 2007/0094629 | A1 * | 4/2007 | Alter ..................... | G06F 30/392 |
| | | | | 716/139 |
| 2007/0101221 | A1 | 5/2007 | Fredrickson et al. | |
| 2009/0172615 | A1 * | 7/2009 | Ortiz ............. | G01R 31/318536 |
| | | | | 716/106 |
| 2010/0205492 | A1 * | 8/2010 | Sinanoglu ...... | G01R 31/318335 |
| | | | | 714/E11.155 |
| 2010/0218061 | A1 * | 8/2010 | Sinanoglu ...... | G01R 31/318547 |
| | | | | 714/E11.155 |
| 2011/0219277 | A1 | 9/2011 | Jen et al. | |
| 2017/0323030 | A1 * | 11/2017 | Datta ................... | G06F 30/394 |
| 2017/0323032 | A1 * | 11/2017 | Datta ................... | G06F 30/394 |
| 2018/0181686 | A1 * | 6/2018 | Datta ................... | G06F 30/392 |
| 2018/0321306 | A1 * | 11/2018 | Chaudhuri ......... | G01R 31/3177 |
| 2020/0004913 | A1 * | 1/2020 | Goel ..................... | G06F 30/333 |
| 2020/0380189 | A1 * | 12/2020 | Wu ................. | G01R 31/318583 |
| 2023/0141786 | A1 * | 5/2023 | Son ................. | G01R 31/318597 |
| | | | | 714/726 |

FOREIGN PATENT DOCUMENTS

| | | | |
|---|---|---|---|
| CN | 117764010 A | * | 3/2024 |
| CN | 118332979 A | | 7/2024 |
| JP | 2009295015 A | * | 12/2009 |

OTHER PUBLICATIONS

Kahng et al. "Incremental Multiple-Scan Chain Ordering for ECO Flip-Flop Insertion", IEEE/ACM International Conference on Computer-Aided Design, Nov. 18-21, 2013, 8 pages. (Year: 2013).*

Palepu et al., "Accelerate SoC Design Flow with Functional ECO", Synopsys, Aug. 9, 2022, 8 pages. (Year: 2022).*

Chung et al., "Comprehensive Optimization of Scan Chain TIming During Late-Stage IC Implementation", ACM, 2016, 6 pages. (Year: 2016).*

Yu et al., WIPO Machine English Tranlsation of Chinese Patent Document No. CN-118332979-A, published Jul. 12, 2024, machine translated on Apr. 14, 2026, 3 pages. (Year: 2024).*

Siemens, "Reversible chain diagnosis", siemens.com/data, 2021, 9 pages. (Year: 2021).*

Yu Huang et al., <Synthesis of Scan Chains for Netlist Descriptions at RT-Level> <Journal of Electronic Testing>, Apr. 30, 2002, pp. 189-201.

Easy-Logic Technology, <Repair of the Scanning Chain During Functional ECO> https://www.easylogiceda.com/upload/image/20230628/649c0ae74dfa8.pdf, Jun. 28, 2023, pp. 1-4.

* cited by examiner

SYSTEM AND METHOD FOR PERFORMING SCAN CHAIN ECO

CROSS-REFERENCE TO RELATED APPLICATIONS

The present application claims priority to Chinese Patent Application No. 2024109814901, filed Jul. 22, 2024, the entire disclosure of which is incorporated herein by reference.

TECHNICAL FIELD

The present application belongs to the field of Engineering Change Order (ECO) technology, particularly relates to a system and method for performing a scan chain ECO.

BACKGROUND

Engineering Change Order (ECO) is a process of directly modifying integrated circuits in the digital chip design flow, i.e., the process of modifying the gate-level netlist of each design phase (synthesis phase, DFT phase, PNR phase, etc.), so that the logic function of the modified circuits is in line with the expectations.

The scan chain ECO is an important step during ECO, which is an incremental design methodology used to revise an existing application specific integrated circuit (ASIC) design. The basic principle of the scan chain is to connect all the flip-flops in the design into a chain, driven by a unified scan clk, so that the pre-designed scan pattern can be fed into the chip, and then the capture enable is turned on, so that the output of Q-terminal of each flip-flop passes into the combinational circuits they drive, and a next level of Q-terminal of the flip-flop in the scan chain will capture the output of the combined circuit, and then capture enable is disabled, this set of vectors and the expectations pre-calculated by tools compared to the basis for determining whether there is a manufacturing error in the chip. Scan's workflow is first of all scan insertion (scan chain insertion), after the design of the functionality of the chip is finished, that is, a process of the entire netlist from a bunch of ordinary registers being replaced by the scan of the register, so that the newly added registers and the original registers together constitute the scan chain and participate in the test of the chip.

Once the RTL code is modified, new registers are added or old registers are deleted, the scan chain ECO can update the scan chain locally to accommodate these register changes while preserving most of the other areas of the circuit. Traditionally, DFT engineers have had to address scan chain vulnerabilities created during Functional ECO tasks. Since scan chains and test patterns are typically generated by the ATPG tool, DFT engineers typically lack an efficient way to make the necessary modifications based on the changes in the ECO patch report. The ATPG tool must be used to recheck the cause of the error and refer back to the established scan chain architecture to correct the design rule check (DFT DRC) error caused by the Functional ECO. Or the newly added registers are discarded directly, resulting in lower test coverage and higher test risk. Or the already useless and removable registers are ignored directly, which may affect the back-end wiring performance and timing convergence.

SUMMARY

The present application provides a system and a method for performing a scan chain ECO, with the objective of using the system and method to empower a designer to efficiently perform scan chain ECO tasks to correspond to additions and deletions of registers in a design and to reduce a situation that the registers in the scan chain are missed up or mistaken to be up.

The solution of the present application is as below:

According to a first aspect, the present application provides a system for performing a scan chain engineering change order (ECO), including: a first input module, a second input module, a scan chain ECO module and an output module, wherein the first input module and the second input module are connected to the scan chain ECO module, respectively;

the first input module, configured for receiving an original netlist input by a user as first input information, wherein the original netlist contains original scan chain information;

the second input module, configured for receiving a register modification list and a scan DEF file input by the user as second input information, the register modification list is configured to indicate register information to be up-chained and/or register information to be down-chained;

the scan chain ECO module connected to the output module, configured for modifying the original netlist based on the first input information and the second input information, to complete up-chaining and/or down-chaining of a list of registers in the second input information to obtain a modified scan chain netlist; and the output module, configured for receiving the modified scan chain netlist and returning the modified scan chain netlist to the user.

In one embodiment, the original netlist received by the first input module is automatically generated by a third-party ECO tool or manually created by the user, and the original scan chain information comprises at least a number of scan chains and distribution data of registers contained in each scan chain.

In one embodiment, modifying the original netlist based on the first input information and the second input information includes:

when the second input information contains register information to be down-chained, the scan chain ECO module finding a distribution of registers to be down-chained in the original netlist, and deleting corresponding registers in the scan chain, to complete the down-chaining of the registers;

when the second input information contains register information to be up-chained, then the scan chain ECO module inserting a register to be up-chained into the scan chain of a current netlist based on a distribution of registers in a current netlist and a preset operation logic, to complete the up-chaining of the registers; and when the second input information contains information of register to be down-chained and to be up-chained, performing the down-chaining of the registers first, and then preforming the up-chaining of the registers.

In one embodiment, the preset operation logic includes: when the registers to be up-chained are inserted, first searching the scan chain to find whether there is a target register in a same module and a same clock domain as the register to be up-chained;

in response to that there is the target register, inserting the register to be up-chained into a front end of the target register; and in response to that there is no target register, searching the scan chain to find whether there is the target register in the same clock domain as the register to be up-chained;

in response to that there is the target register, inserting the register to be up-chained into the front end of the target register;

in response to that there is no target register, inserting the register to be up-chained into the scan chain in a different clock domain.

In one embodiment, after completing the up-chaining and/or down-chaining of the registers, using the scan DEF file to determine a clock domain of the register based on the PARTITION attribute of each scan chain, comparing whether the PARTITION attribute at clock signal ends of two consecutive registers are the same;

in response to that they are the same, determining that the two consecutive registers belong to the same clock domain; and in response to that they are not the same, determining that the two consecutive registers belong to different clock domains, and inserting a latch between the two consecutive registers.

According to a second aspect, the present application provides a method for performing a scan chain engineering change order (ECO), including:

step S1, receiving an original netlist input by a user as first input information, wherein the original netlist contains original scan chain information;

step S2, receiving a register modification list and a scan DEF file input by the user as second input information, the register modification list is configured to indicate register information to be up-chained and/or register information to be down-chained;

step S3, modifying the original netlist based on the first input information and the second input information, to complete up-chaining and/or down-chaining of a list of registers in the second input information to obtain a modified scan chain netlist; and step S4, receiving the modified scan chain netlist and returning the modified scan chain netlist to the user.

In one embodiment, the original netlist received by the first input module is automatically generated by a third-party ECO tool or manually created by the user, and the original scan chain information comprises at least a number of scan chains and distribution data of registers contained in each scan chain.

In one embodiment, modifying the original netlist based on the first input information and the second input information includes:

when the second input information contains register information to be down-chained, the scan chain ECO module finding a distribution of registers to be down-chained in the original netlist, and deleting corresponding registers in the scan chain, to complete the down-chaining of the registers;

when the second input information contains register information to be up-chained, then the scan chain ECO module inserting a register to be up-chained into the scan chain of a current netlist based on a distribution of registers in a current netlist and a preset operation logic, to complete the up-chaining of the registers; and when the second input information contains information of register to be down-chained and to be up-chained, performing the down-chaining of the registers first, and then preforming the up-chaining of the registers.

In one embodiment, the preset operation logic includes: when the registers to be up-chained are inserted, first searching the scan chain to find whether there is a target register in a same module and a same clock domain as the register to be up-chained;

in response to that there is the target register, inserting the register to be up-chained into a front end of the target register; and in response to that there is no target register, searching the scan chain to find whether there is the target register in the same clock domain as the register to be up-chained;

in response to that there is the target register, inserting the register to be up-chained into the front end of the target register;

in response to that there is no target register, inserting the register to be up-chained into the scan chain in a different clock domain.

In one embodiment, after completing the up-chaining and/or down-chaining of the registers, using the scan DEF file to determine a clock domain of the register based on the PARTITION attribute of each scan chain;

comparing whether the PARTITION attribute at clock signal ends of two consecutive registers are the same;

in response to that they are the same, determining that the two consecutive registers belong to the same clock domain; and in response to that they are not the same, determining that the two consecutive registers belong to different clock domains, and inserting a latch between the two consecutive registers.

The beneficial effects of the present application over the related art are:

The method of the present application for performing a scan chain ECO prevents loss of test coverage due to misoperations such as Functional ECO, and is used easily and provides optimized patches to achieve the best scan chain. The system is a plug-and-play tool that can be easily integrated with design flows of the third-party.

DETAILED DESCRIPTION OF THE EMBODIMENTS

In order to make the objects, technical solutions and advantages of the present application clearer, the technical solutions in the present application will be described clearly and completely in the following, and it is obvious that the described embodiments are a part of the embodiments of the present application and not all of the embodiments. Based on the embodiments in the present application, all other embodiments obtained by those skilled in the art fall within the scope of the present application without making any creative labour.

First Embodiment

Figure 1:
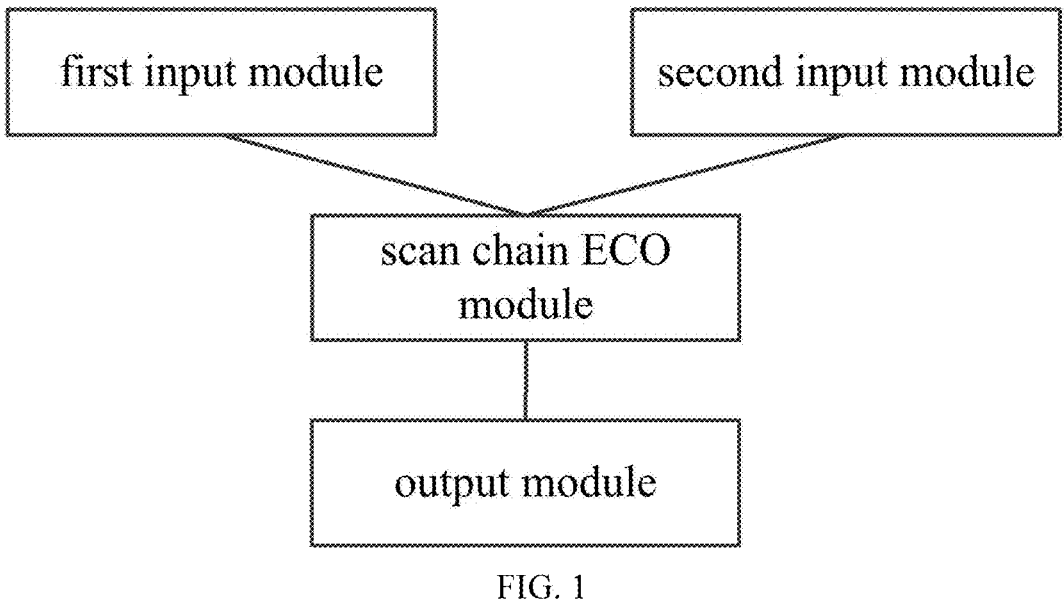
FIG. 1 is a schematic diagram of a system for performing a scan chain ECO of the present application.

FIG. 1 is a schematic diagram of a system of the present application for performing a scan chain ECO, the system includes a first input module, a second input module, a scan chain ECO module and an output module, the first input module and the second input module are connected to the scan chain ECO module, respectively;

the first input module, configured for receiving an original netlist input by a user as first input information, wherein the original netlist contains original scan chain information;

the original netlist received by the first input module is automatically generated by a third-party ECO tool or manually created by the user, and the original scan chain information comprises at least a number of scan chains and distribution data of registers contained in each scan chain; and the second input module, configured for receiving a register modification list and a scan DEF file input by the user as second input information, the register modification list is configured to indicate register information to be up-chained and/or register information to be down-chained.

It should be noted that the system requires two inputs, which are the original netlist with the scan chain and the list of registers to be incremented or decremented, in addition to the input of the scan DEF file to assist in the flow processing. The original netlist with scan chains is provided by the user, while the list of registers to incremented or decremented can be obtained from reports generated by third-party ECO tools (e.g., EasylogicECO) or from register update lists manually created by the user for specific ECO cases.

In addition, the system supports a number of optional inputs, such as the user assigns which registers can or cannot be inserted into the scan chain, or the user assigns which scan chains that the registers can or cannot be inserted into; and the user assigns which registers that which scan chains must be inserted or not into. With the scan chain ECO tool, a netlist with scan chains modified can be obtained according to the above inputs.

The scan chain ECO module is connected to the output module configured for modifying the original netlist based on the first input information and the second input information, to complete up-chaining and/or down-chaining of a list of registers in the second input information to obtain a modified scan chain netlist.

The modifying the original netlist based on the first input information and the second input information includes:

when the second input information contains register information to be down-chained, the scan chain ECO module finding a distribution of registers to be down-chained in the original netlist, and deleting corresponding registers in the scan chain, to complete the down-chaining of the registers;

when the second input information contains register information to be up-chained, then the scan chain ECO module inserting a register to be up-chained into the scan chain of a current netlist based on a distribution of registers in a current netlist and a preset operation logic, to complete the up-chaining of the registers; and when the second input information contains information of register to be down-chained and to be up-chained, performing the down-chaining of the registers first, and then preforming the up-chaining of the registers.

The preset operation logic includes: when the registers to be up-chained are inserted, first searching the scan chain to find whether there is a target register in a same module and a same clock domain as the register to be up-chained; in response to that there is the target register, inserting the register to be up-chained into a front end of the target register; and in response to that there is no target register, searching the scan chain to find whether there is the target register in the same clock domain as the register to be up-chained; in response to that there is the target register, inserting the register to be up-chained into the front end of the target register; in response to that there is no target register, inserting the register to be up-chained into the scan chain in a different clock domain.

After completing the up-chaining and/or down-chaining of the registers, using the scan DEF file to determine a clock domain of the register based on the PARTITION attribute of each scan chain, comparing whether the PARTITION attribute at clock signal ends of two consecutive registers are the same; in response to that they are the same, determining that the two consecutive registers belong to the same clock domain; and in response to that they are not the same, determining that the two consecutive registers belong to different clock domains, and inserting a latch between the two consecutive registers.

Supposing that there is an original hardware design netlist that contains multiple scan chains and some already placed registers. Due to design changes, some registers need to be removed from the scan chains (down-chaining) and some new registers need to be added into the scan chains (up-chaining). In addition, it needs to ensure that latches are added between registers that cross clock domain boundaries to ensure data synchronisation.

The first input module receives the original netlist file input by the user via a graphical interface or command line tool, the original netlist file describes the overall structure of the design and the initial layout of the scan chain. The system reads the netlist file and parses out information such as the number of scan chains and the distribution data of the registers contained in each scan chain.

The second input module receives a register modification list from the user, which specifies which registers need to be up-chained and which need to be down-chained. The user also provides the scan DEF file, which contains key information such as the PARTITION attribute of the scan chain for determination of the clock domain.

The scan chain ECO module performs the down-chain operation first, based on the register modification list, locates the registers in the original netlist that need to be down-chained and updates the structure of the scan chain to remove these registers, and then performs the up-chain operation, and searches for a suitable location in the scan chain to insert new registers according to the preset operation logic. The operation logic takes into account the module and clock domain information of the registers. When performing an up-chain operation that is across clock domains, the module uses the PARTITION attribute in the scan DEF file to determine whether the registers are in different clock domains. If so, a latch is inserted between the related registers.

The output module generates a modified scan chain netlist file, which contains the updated scan chain structure and the layout of the registers. The system returns the modified netlist file to the user, the user can carry out subsequent design or verification work based on the modified netlist file.

Second Embodiment

Figure 2:
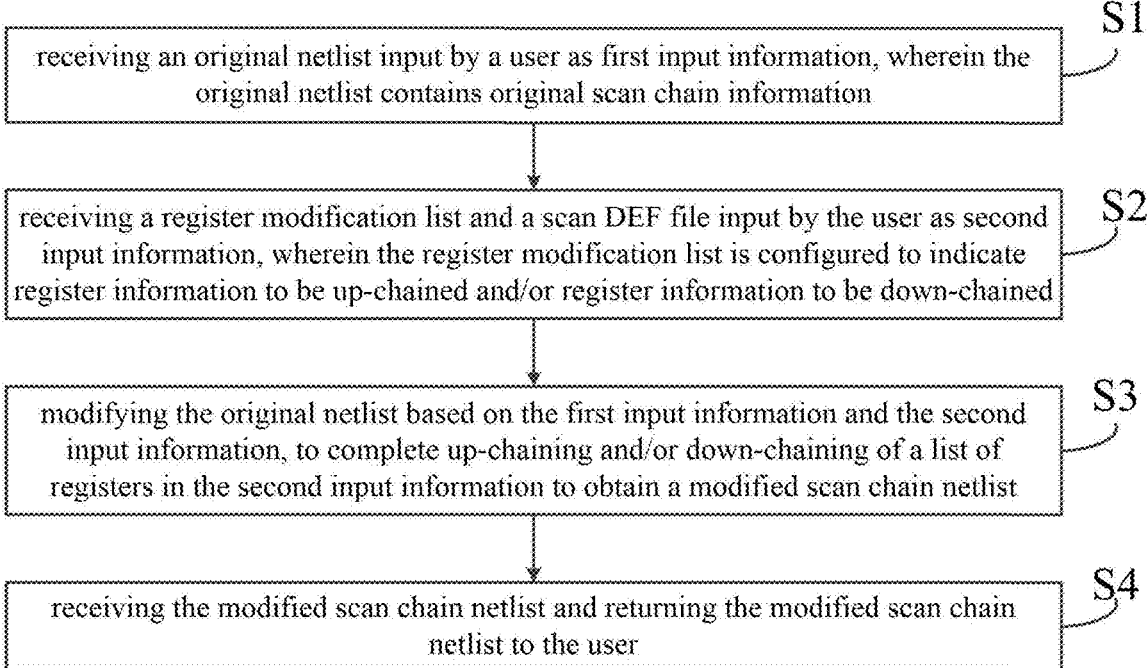
FIG. 2 is a flowchart of a method of performing a scan chain ECO of the present application.

FIG. 2 is a flowchart of a method for performing a scan chain ECO of the present application, the method includes:

Step S1, receiving an original netlist input by a user as first input information, wherein the original netlist contains original scan chain information.

The original netlist received by the first input module is automatically generated by a third-party ECO tool or manually created by the user, and the original scan chain information includes at least a number of scan chains and distribution data of registers contained in each scan chain.

Step S2, receiving a register modification list and a scan DEF file input by the user as second input information, wherein the register modification list is configured to indicate register information to be up-chained and/or register information to be down-chained.

Step S3, modifying the original netlist based on the first input information and the second input information, to complete up-chaining and/or down-chaining of a list of registers in the second input information to obtain a modified scan chain netlist.

The modifying the original netlist based on the first input information and the second input information includes:

when the second input information contains register information to be down-chained, the scan chain ECO module finding a distribution of registers to be down-chained in the original netlist, and deleting corresponding registers in the scan chain, to complete the down-chaining of the registers;

when the second input information contains register information to be up-chained, then the scan chain ECO module inserting a register to be up-chained into the scan chain of a current netlist based on a distribution of registers in a current netlist and a preset operation logic, to complete the up-chaining of the registers; and when the second input information contains information of register to be down-chained and to be up-chained, performing the down-chaining of the registers first, and then preforming the up-chaining of the registers.

The preset operation logic includes: when the registers to be up-chained are inserted, first searching the scan chain to find whether there is a target register in a same module and a same clock domain as the register to be up-chained; in response to that there is the target register, inserting the register to be up-chained into a front end of the target register; and in response to that there is no target register, searching the scan chain to find whether there is the target register in the same clock domain as the register to be up-chained; in response to that there is the target register, inserting the register to be up-chained into the front end of the target register; in response to that there is no target register, inserting the register to be up-chained into the scan chain in a different clock domain.

Step S4, receiving the modified scan chain netlist and returning the modified scan chain netlist to the user.

After completing the up-chaining and/or down-chaining of the registers, using the scan DEF file to determine a clock domain of the register based on the PARTITION attribute of each scan chain, comparing whether the PARTITION attribute at clock signal ends of two consecutive registers are the same; if they are the same, determining that the two consecutive registers belong to the same clock domain; and if they are not the same, determining that the two consecutive registers belong to different clock domains, and inserting a latch between the two consecutive registers.

Figure 3:
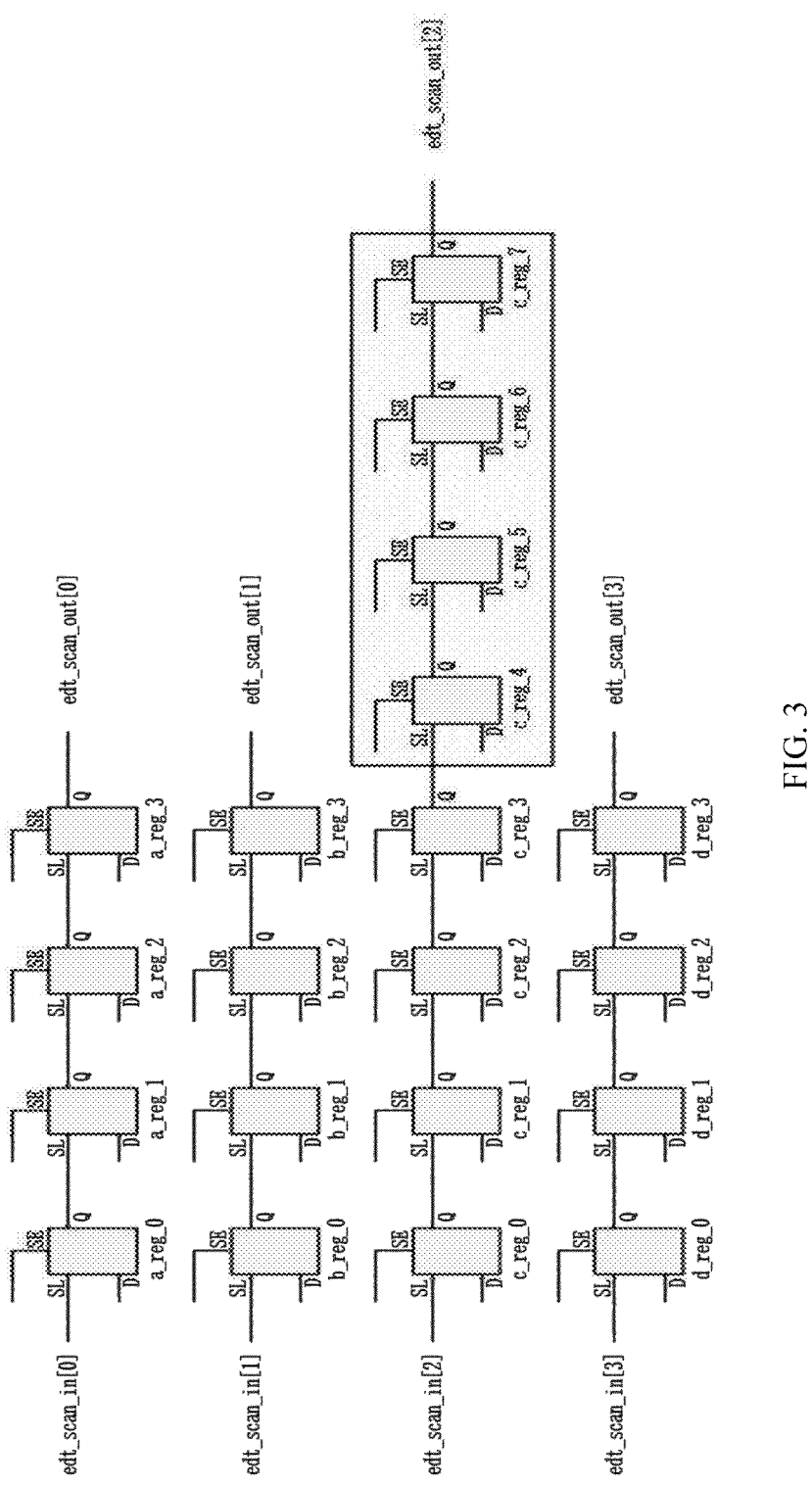
FIG. 3 is a schematic diagram of a scan chain in the original netlist of the present application.

FIG. 3 is a schematic diagram of the scan chains in the original netlist of the present application, there are 4 scan chains in the netlist, respectively, taking the signals edt_scan_in[0]-edt_scan_in[3] as the beginning of the scan chains, and taking the signals edt_scan_out[0]-edt_scan_out[3] as the end of the scan chain, in addition to the fact that several registers already exist on all four scan chains.

Figure 4:
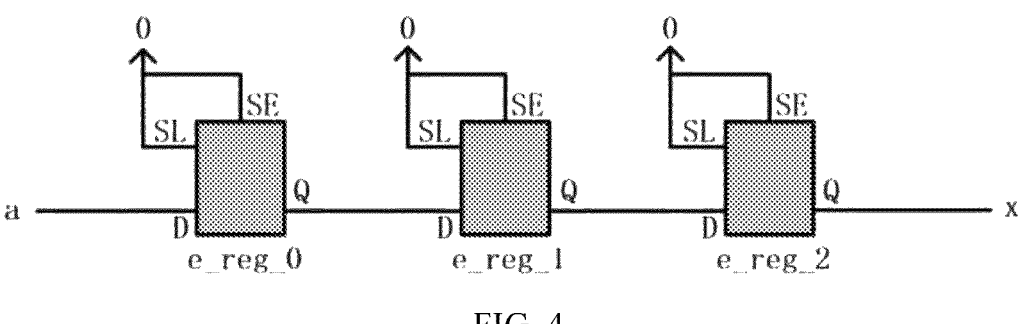
FIG. 4 is a schematic diagram of registers to be chained of the present application.

On the scan chain where the signal edt_scan_out[2] is the end of the scan chain, the registers numbered c_reg_4 to c_reg_7 need to perform the down-chaining operation. FIG. 4 is a schematic diagram of the registers that need to be up-chained in the present application, and there are registers numbered e_reg_0 to e_reg_2 that need to be up-chained in a particular module, which can be obtained from reports generated by third-party ECO tools or from register update lists manually created by the user for specific ECO cases.

Figure 5:
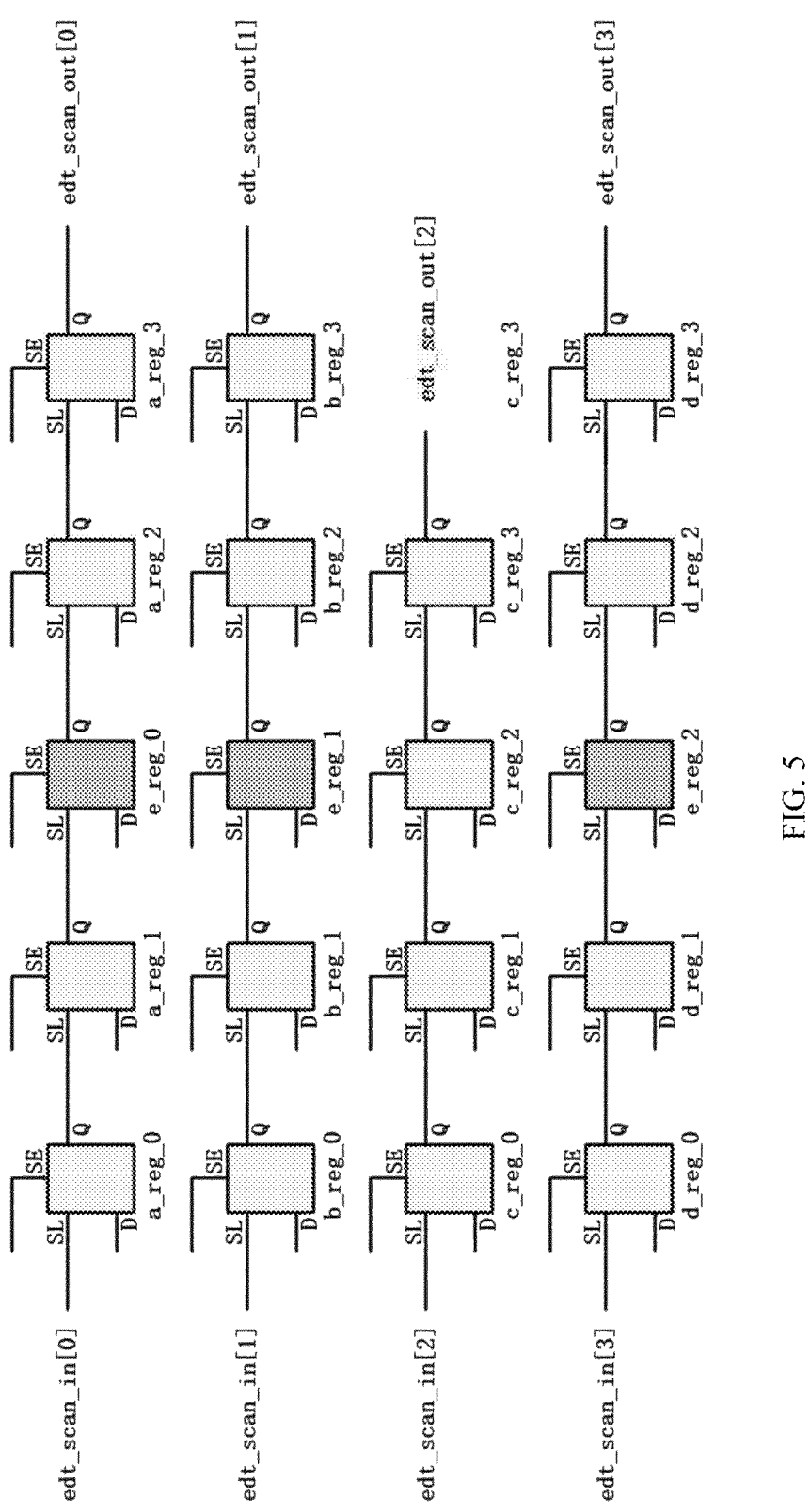
FIG. 5 is a schematic diagram of a scan chain of the present application after being processed by the method of the scan chain ECO.

At this time, the distribution of registers to be down-chained is found in the original netlist, the registers numbered c_reg_4 to c_reg_7 in the scan chain are deleted to complete the down-chaining of the register; according to the distribution of registers in the current netlist, the registers numbered e_reg_0 to e_reg_2 are inserted into the scan chain of the current netlist to complete the up-chaining of the registers, and the scan chain processed by the scan chain ECO method is shown in FIG. 5. The registers numbered e_reg_0 to e_reg_2 are inserted into a center of the scan chain where takes signals edt_scan_out[0], edt_scan_out[1], and edt_scan_out[3] as the end of the scan chain, respectively.

The following technical points in the up-chaining operation of the registers are taken into:

As shown in FIG. 5, it considers the clock domain that the register belongs to when inserting the register into the scan chain, and tries to insert the registers to be up-chained into the register that is in the same module and in the same clock domain as the the registers to be up-chained. If it cannot be satisfied at the same time, it ensures that it is in the same clock domain first. If it is not possible to insert the registers into the same clock domain, a latch is added between two registers in different clock domains in order to ensure the synchronisation of the register clocks.

In addition, each scan chain has a current maximum length, and the user can also set the maximum chain length manually to limit the maximum number of registers in each scan chain. When inserting registers, it ensures that the number of registers after insertion does not exceed the maximum length of the chain, and ensures that the registers are balanced as much as possible, so that there is no big difference in the number of registers in each scan chain.

The present application is illustrated by specific embodiments, and those skilled in the art should understand that various transformations and equivalent substitutions can be made to the present application without departing from the scope of the present application. In addition, various modifications can be made to the present application for specific situations or materials without departing from the scope of the present application. Therefore, the present application is not limited to the specific embodiments disclosed, but should include all embodiments falling within the scope of the claims of the present application.

What is claimed is:

1. A system for performing a scan chain engineering change order (ECO), comprising:

a first input module, a second input module, a scan chain ECO module and an output module, wherein the first input module and the second input module are connected to the scan chain ECO module, respectively;

the first input module, configured for receiving an original netlist input by a user as first input information, wherein the original netlist contains original scan chain information;

the second input module, configured for receiving a register modification list and a scan DEF file input by the user as second input information, wherein the register modification list is configured to indicate register information to be up-chained and/or register information to be down-chained;

the scan chain ECO module connected to the output module, configured for modifying the original netlist based on the first input information and the second input information, to complete up-chaining and/or down-chaining of a list of registers in the second input information to obtain a modified scan chain netlist; and the output module, configured for receiving the modified scan chain netlist and returning the modified scan chain netlist to the user;

wherein modifying the original netlist based on the first input information and the second input information comprises:

when the second input information contains register information to be down-chained, the scan chain ECO module finding a distribution of registers to be down-chained in the original netlist, and deleting corresponding registers in the scan chain, to complete the down-chaining of the registers;

when the second input information contains register information to be up-chained, then the scan chain ECO module inserting a register to be up-chained into the scan chain of a current netlist based on a distribution of registers in a current netlist and a preset operation logic, to complete the up-chaining of the registers; and when the second input information contains information of register to be down-chained and to be up-chained, performing the down-chaining of the registers first, and then preforming the up-chaining of the registers;

wherein the preset operation logic comprises: when the registers to be up-chained are inserted, first searching the scan chain to find whether there is a target register in a same module and a same clock domain as the register to be up-chained;

in response to that there is the target register, inserting the register to be up-chained into a front end of the target register; and in response to that there is no target register, searching the scan chain to find whether there is the target register in the same clock domain as the register to be up-chained;

in response to that there is the target register, inserting the register to be up-chained into the front end of the target register;

in response to that there is no target register, inserting the register to be up-chained into the scan chain in a different clock domain.

2. The system for performing the scan chain ECO according to claim 1, wherein the original netlist received by the first input module is automatically generated by a third-party ECO tool or manually created by the user, and the original scan chain information comprises at least a number of scan chains and distribution data of registers contained in each scan chain.

3. The system for performing the scan chain ECO according to claim 2, wherein after completing the up-chaining and/or down-chaining of the registers, using the scan DEF file to determine a clock domain of the register based on the PARTITION attribute of each scan chain, comparing whether the PARTITION attribute at clock signal ends of two consecutive registers are the same;

in response to that they are the same, determining that the two consecutive registers belong to the same clock domain; and in response to that they are not the same, determining that the two consecutive registers belong to different clock domains, and inserting a latch between the two consecutive registers.

4. A method for performing a scan chain engineering change order (ECO), comprising:

step S1, receiving an original netlist input by a user as first input information, wherein the original netlist contains original scan chain information;

step S2, receiving a register modification list and a scan DEF file input by the user as second input information, wherein the register modification list is configured to indicate register information to be up-chained and/or register information to be down-chained;

step S3, modifying the original netlist based on the first input information and the second input information, to complete up-chaining and/or down-chaining of a list of registers in the second input information to obtain a modified scan chain netlist; and step S4, receiving the modified scan chain netlist and returning the modified scan chain netlist to the user;

wherein modifying the original netlist based on the first input information and the second input information comprises:

when the second input information contains register information to be down-chained, the scan chain ECO module finding a distribution of registers to be down-chained in the original netlist, and deleting corresponding registers in the scan chain, to complete the down-chaining of the registers;

when the second input information contains register information to be up-chained, then the scan chain ECO module inserting a register to be up-chained into the scan chain of a current netlist based on a distribution of registers in a current netlist and a preset operation logic, to complete the up-chaining of the registers; and when the second input information contains information of register to be down-chained and to be up-chained, performing the down-chaining of the registers first, and then preforming the up-chaining of the registers;

wherein the preset operation logic comprises: when the registers to be up-chained are inserted, first searching the scan chain to find whether there is a target register in a same module and a same clock domain as the register to be up-chained;

in response to that there is the target register, inserting the register to be up-chained into a front end of the target register; and in response to that there is no target register, searching the scan chain to find whether there is the target register in the same clock domain as the register to be up-chained;

in response to that there is the target register, inserting the register to be up-chained into the front end of the target register;

in response to that there is no target register, inserting the register to be up-chained into the scan chain in a different clock domain.

5. The method for performing the scan chain ECO according to claim 4, wherein the original netlist received by the first input module is automatically generated by a third-party ECO tool or manually created by the user, and the original scan chain information comprises at least a number of scan chains and distribution data of registers contained in each scan chain.

6. The method for performing the scan chain ECO according to claim 5, wherein after completing the up-chaining and/or down-chaining of the registers, using the scan DEF file to determine a clock domain of the register based on the PARTITION attribute of each scan chain, comparing whether the PARTITION attribute at clock signal ends of two consecutive registers are the same;

in response to that they are the same, determining that the two consecutive registers belong to the same clock domain; and in response to that they are not the same, determining that the two consecutive registers belong to different clock domains, and inserting a latch between the two consecutive registers.

* * * * *